United States Patent
Yi

(10) Patent No.: US 9,287,335 B2
(45) Date of Patent: Mar. 15, 2016

(54) ORGANIC LIGHT-EMITTING DIODE (OLED) DISPLAY AND METHOD OF MANUFACTURING THE SAME

(71) Applicant: Samsung Display Co., Ltd., Yongin, Gyeonggi-Do (KR)

(72) Inventor: Chung Yi, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 156 days.

(21) Appl. No.: 13/916,433

(22) Filed: Jun. 12, 2013

(65) Prior Publication Data

US 2014/0138641 A1 May 22, 2014

(30) Foreign Application Priority Data

Nov. 22, 2012 (KR) .................. 10-2012-0133144

(51) Int. Cl.
*H01L 51/50* (2006.01)
*H01L 27/32* (2006.01)
*H01L 51/56* (2006.01)
*H01L 33/48* (2010.01)
*H01L 51/52* (2006.01)

(52) U.S. Cl.
CPC ............ *H01L 27/3244* (2013.01); *H01L 51/56* (2013.01); *H01L 51/524* (2013.01)

(58) Field of Classification Search
CPC ..... H01L 27/3244; H01L 51/50; H01L 51/56; H01L 51/524–51/5246; H01L 2251/566; H01L 2251/5338
USPC .......... 257/724–725, 730; 438/26, 28, 33–34, 438/106, 110–114
See application file for complete search history.

(56) References Cited

U.S. PATENT DOCUMENTS

| | | | | |
|---|---|---|---|---|
| 5,691,248 A * | 11/1997 | Cronin et al. | ................. | 438/109 |
| 5,923,995 A * | 7/1999 | Kao et al. | ...................... | 438/460 |
| 5,925,924 A * | 7/1999 | Cronin et al. | ................. | 257/622 |
| 6,025,251 A * | 2/2000 | Jakowetz et al. | ............. | 438/464 |
| 6,562,647 B2 * | 5/2003 | Zandman et al. | ............... | 438/33 |
| 6,599,765 B1 * | 7/2003 | Boyd | ..................... | B24B 49/12 |
| | | | | 356/630 |
| 6,656,827 B1 * | 12/2003 | Tsao et al. | .................... | 438/612 |
| 7,208,335 B2 * | 4/2007 | Boon et al. | ...................... | 438/33 |
| 7,208,337 B2 * | 4/2007 | Eisert et al. | .................... | 438/42 |

(Continued)

FOREIGN PATENT DOCUMENTS

| KR | 10-2009-0063394 A | 6/2009 |
|---|---|---|
| KR | 10-2009-0121894 A | 11/2009 |

(Continued)

*Primary Examiner* — Laura Menz
*Assistant Examiner* — Maliheh Malek
(74) *Attorney, Agent, or Firm* — Knobbe, Martens, Olson & Bear, LLP

(57) ABSTRACT

An organic light-emitting diode (OLED) display and a method of manufacturing the same are disclosed. In one aspect, the method includes: forming a barrier layer on a base substrate of a mother panel, forming a plurality of display units in units of cell panels on the barrier layer and forming an encapsulation layer on each of the plurality of display units of the cell panels. The method further includes applying an organic film to an interface portion between the cell panels and cutting along the interface portion applied with the organic film. Accordingly, cracks are prevented from occurring in the barrier layer when the mother panel is cut in units of the cell panels, thereby reducing a defect rate of a product and stabilizing its quality.

17 Claims, 2 Drawing Sheets

(56) References Cited

U.S. PATENT DOCUMENTS

| | | | |
|---|---|---|---|
| 7,459,377 B2* | 12/2008 | Ueda et al. | 438/462 |
| 7,514,291 B2* | 4/2009 | Akram | 438/110 |
| 7,566,634 B2* | 7/2009 | Beyne et al. | 438/462 |
| 7,955,955 B2* | 6/2011 | Lane et al. | 438/465 |
| 7,968,882 B2 | 6/2011 | Lee et al. | |
| 8,283,677 B2* | 10/2012 | Takizawa et al. | 257/81 |
| 2002/0042189 A1* | 4/2002 | Tanaka | 438/450 |
| 2002/0149320 A1* | 10/2002 | Maruyama et al. | 315/169.3 |
| 2003/0089991 A1* | 5/2003 | Yamazaki et al. | 257/759 |
| 2003/0143819 A1* | 7/2003 | Hedler et al. | 438/462 |
| 2004/0032026 A1* | 2/2004 | Yang | H01L 23/3114 257/734 |
| 2004/0235210 A1* | 11/2004 | Tamura et al. | 438/22 |
| 2005/0148121 A1* | 7/2005 | Yamazaki et al. | 438/149 |
| 2005/0161740 A1* | 7/2005 | Park et al. | 257/347 |
| 2007/0023790 A1* | 2/2007 | Ohnuma et al. | 257/267 |
| 2007/0087524 A1* | 4/2007 | Montgomery | 438/427 |
| 2007/0176185 A1* | 8/2007 | Lee et al. | 257/79 |
| 2007/0177069 A1* | 8/2007 | Lee | 349/56 |
| 2008/0006910 A1* | 1/2008 | Miyata | H01L 23/3114 257/622 |
| 2008/0128904 A1* | 6/2008 | Sakamoto | H01L 21/563 257/737 |
| 2008/0142791 A1* | 6/2008 | Kim et al. | 257/40 |
| 2008/0179611 A1* | 7/2008 | Chitnis et al. | 257/98 |
| 2008/0197486 A1* | 8/2008 | Asakawa | 257/734 |
| 2008/0213984 A1* | 9/2008 | Moriwaka | 438/487 |
| 2008/0220151 A1* | 9/2008 | Kataoka | 427/66 |
| 2009/0091001 A1* | 4/2009 | Park | H01L 23/3185 257/620 |
| 2009/0140648 A1* | 6/2009 | Tohyama et al. | 313/505 |
| 2009/0170288 A1* | 7/2009 | Ito | H01L 21/78 438/462 |
| 2009/0174023 A1* | 7/2009 | Takahashi | H01L 27/14692 257/458 |
| 2009/0183766 A1* | 7/2009 | Takahashi | H01L 31/0232 136/255 |
| 2009/0230399 A1* | 9/2009 | Sawamizu et al. | 257/59 |
| 2009/0243094 A1* | 10/2009 | Itoh | H01L 21/561 257/737 |
| 2010/0066240 A1* | 3/2010 | Park et al. | 313/504 |
| 2010/0221984 A1* | 9/2010 | Doura | B24B 37/205 451/41 |
| 2010/0252857 A1* | 10/2010 | Nakatani et al. | 257/100 |
| 2010/0261335 A1* | 10/2010 | Andry et al. | 438/462 |
| 2010/0330748 A1* | 12/2010 | Chu et al. | 438/127 |
| 2011/0001146 A1* | 1/2011 | Yamazaki et al. | 257/79 |
| 2011/0006671 A1* | 1/2011 | Kwon et al. | 313/505 |
| 2011/0237006 A1* | 9/2011 | Sarfert et al. | 438/26 |
| 2011/0253709 A1* | 10/2011 | Kang et al. | 220/2.1 R |
| 2012/0168214 A1* | 7/2012 | Kashiwagi | H01L 23/3121 174/257 |
| 2012/0235170 A1* | 9/2012 | Lee | 257/88 |
| 2012/0235282 A1* | 9/2012 | Tomono | H01L 21/6836 257/618 |
| 2012/0248472 A1* | 10/2012 | Schwab | 257/88 |
| 2012/0262058 A1* | 10/2012 | Park | 313/512 |
| 2013/0011969 A1* | 1/2013 | Chen et al. | 438/111 |
| 2013/0095586 A1* | 4/2013 | Kim et al. | 438/33 |
| 2013/0126082 A1* | 5/2013 | Kim | B32B 3/26 156/250 |
| 2013/0228754 A1* | 9/2013 | Park | 257/40 |
| 2013/0233378 A1* | 9/2013 | Moslehi et al. | 136/256 |
| 2013/0234193 A1* | 9/2013 | Odnoblyudov et al. | 257/99 |
| 2013/0285024 A1* | 10/2013 | Ma et al. | 257/40 |
| 2014/0008625 A1* | 1/2014 | Hiraoka et al. | 257/40 |
| 2014/0027737 A1* | 1/2014 | Yang | 257/40 |
| 2014/0034994 A1* | 2/2014 | Yamane et al. | 257/99 |
| 2014/0073072 A1* | 3/2014 | Park | 438/28 |
| 2014/0097430 A1* | 4/2014 | Park et al. | 257/48 |
| 2014/0117342 A1* | 5/2014 | Kwon et al. | 257/40 |
| 2014/0131683 A1* | 5/2014 | Kim et al. | 257/40 |
| 2014/0134763 A1* | 5/2014 | Park et al. | 438/26 |
| 2015/0179616 A1* | 6/2015 | Lin et al. | 438/110 |
| 2015/0263234 A1* | 9/2015 | Cho | H01L 33/007 257/88 |

FOREIGN PATENT DOCUMENTS

| | | |
|---|---|---|
| KR | 10-1015842 B1 | 2/2011 |
| KR | 10-2011-0133881 A | 12/2011 |

* cited by examiner

ORGANIC LIGHT-EMITTING DIODE (OLED) DISPLAY AND METHOD OF MANUFACTURING THE SAME

CROSS-REFERENCE TO RELATED PATENT APPLICATION

This application claims the benefit of Korean Patent Application No. 10-2012-0133144, filed on Nov. 22, 2012, in the Korean Intellectual Property Office, the disclosure of which is incorporated herein in its entirety by reference.

BACKGROUND

1. Field

The described technology generally relates to an organic light-emitting diode (OLED) display and a method of manufacturing the same.

2. Description of the Related Technology

Flat panel displays such as OLEDs may be made thin and flexible due to their operating characteristics and thus have been actively studied.

An OLED display is generally manufactured by forming a large mother panel and then cutting the mother panel in units of cell panels. In general, each of the cell panels on the mother panel is formed by forming a thin film transistor (TFT) including an active layer and a source/drain electrode on a base substrate, applying a planarization film to the TFT, and sequentially forming a pixel electrode, a light-emitting layer, a counter electrode, and an encapsulation layer, and then is cut from the mother panel.

SUMMARY

One inventive aspect is an OLED display which may prevent cracks from occurring at a cut portion when a mother panel is cut in units of cell panels and a method of manufacturing the display.

Another aspect is a method of manufacturing an OLED display, the method including: forming a barrier layer on a base substrate of a mother panel; forming a plurality of display units in units of cell panels on the barrier layer; forming an encapsulation layer on each of the plurality of display units of the cell panels; applying an organic film to an interface portion between the cell panels; and cutting along the interface portion applied with the organic film.

Each of the plurality of display units may include a thin film transistor (TFT) layer, a planarization film formed on the TFT layer, and a light-emitting unit formed on the planarization film, wherein the organic film applied to the interface portion is formed of a same material as a material of the planarization film and is formed at a same time as the planarization film is formed.

Each of the organic film and the planarization film may include any one of polyimide and acryl. The barrier layer may be an inorganic film. The base substrate may be formed of polyimide. The method may further include, before the forming of the barrier layer on one surface of the base substrate formed of polyimide, attaching a carrier substrate formed of a glass material to another surface of the base substrate, and before the cutting along the interface portion, separating the carrier substrate from the base substrate.

The encapsulation layer may have a thin film encapsulation structure in which a plurality of thin films are stacked. The organic film applied to the interface portion may be spaced apart from each of the plurality of display units. The organic film may be formed such that a portion of the organic film directly contacts the base substrate and a remaining portion of the organic film contacts the barrier layer while surrounding an edge portion of the barrier layer.

Another aspect is an OLED display including: a barrier layer that is formed on a base substrate; a display unit that is formed on the barrier layer; an encapsulation layer that is formed on the display unit; and an organic film that is applied to an edge portion of the barrier layer.

The organic film may include any one of polyimide and acryl. The barrier layer may be an inorganic film. The base substrate may be formed of polyimide. The organic film applied at an interface portion may be spaced apart from the display unit.

The organic film may be formed on the edge portion of the barrier layer such that a portion of the organic film directly contacts the base substrate and a remaining portion of the organic film contacts the barrier layer while surrounding the edge portion of the barrier layer.

DETAILED DESCRIPTION

When each of the OLED cell panels is cut from the mother panel, cracks often occur at a cut portion. That is, a barrier layer formed on the base substrate is exposed at an interface portion between the cell panels. Since the barrier layer is a hard inorganic layer, cracks easily occur during the cutting. Once cracks occur, the cracks may become more numerous, wider, and deeper as time elapses, thereby degrading properties of the OLED display. Accordingly, there is a demand for preventing cracks from occurring when a mother panel is cut in units of cell panels.

Embodiments will now be described more fully with reference to the accompanying drawings.

Figure 1:
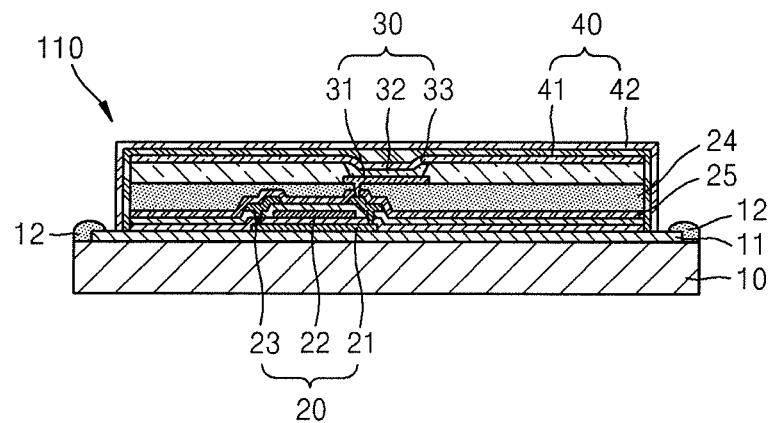
FIG. 1 is a cross-sectional view illustrating an OLED display according to an embodiment.

FIG. 1 is a cross-sectional view illustrating an OLED display according to an embodiment. In FIG. 1, each of cell panels 110 cut from a mother panel is illustrated. That is, in order to manufacture the organic light-emitting display apparatus, a plurality of the cell panels 110 are formed on a plane of the mother panel and the mother panel is cut in units of the cell panels 110. FIG. 1 illustrates a structure of each of the cell panels 110. A method of manufacturing each of the cell panels 110 from the mother panel will be explained below.

Referring to FIG. 1, each of the cell panels 110 of the OLED display includes a barrier layer 11 that is formed on a base substrate 10, a thin film transistor (TFT) layer 20 that is formed on the barrier layer 11, a light-emitting unit 30 that is connected to the TFT layer 20 with a passivation layer 25 and a planarization film 24 therebetween, and an encapsulation layer 40 that covers and protects the light-emitting unit 30.

In one embodiment, the OLED display of FIG. 1 is a flexible display in which the base substrate 10 includes a soft thin film layer formed of polyimide.

The barrier layer 11 is an inorganic film formed of, for example, SiNx, and an edge portion of the barrier layer 11 is covered with an organic film 12 formed of polyimide or acryl. The organic film 12 helps the mother panel to be softly cut in units of the cell panels 110. A process of forming the organic film 12 will be explained below in detail when a method of manufacturing the OLED display is explained with reference to FIGS. 2A through 2D.

The TFT layer 20 includes an active layer 21, a gate electrode 22, and a source/drain electrode 23, like a general TFT.

The passivation layer 25 is an organic film disposed on the TFT layer 20 to cover the TFT layer 20, and the planarization film 24 is an organic film formed on the passivation layer 25. The planarization film 24 is formed of polyimide or acryl, like the organic film 12 formed on the edge portion of the barrier layer 11. The planarization film 24 and the organic film 12 are simultaneously formed when the OLED display is manufactured.

The light-emitting layer 30 includes a pixel electrode, a counter electrode 33, and an organic light-emitting layer 32 disposed between the pixel electrode 31 and the counter electrode 33. The pixel electrode 31 is connected to the source/drain electrode 23 of the TFT layer 20.

When a voltage is applied to the pixel electrode 31 through the TFT layer 20, an appropriate voltage is formed between the pixel electrode 31 and the counter electrode 33, and thus the organic light-emitting layer 32 emits light, thereby forming an image. Hereinafter, an image forming unit including the TFT layer 20 and the light-emitting unit 30 is referred to as a display unit.

The encapsulation layer 40 that covers the display unit and prevents penetration of external moisture may be formed to have a thin film encapsulation structure in which an organic film 41 and an inorganic film 42 are alternately stacked.

Each of the cell panels 110 of the OLED display constructed as described above may be manufactured by using a method described with reference to FIGS. 2A through 2D.

In one embodiment, the OLED display is flexible and uses the soft base substrate 10 formed of polyimide. Accordingly, referring to FIG. 2A, in order to ensure smooth handling during a manufacturing process, the base substrate 10 is formed on a carrier substrate 50 formed of a glass material, and then the carrier substrate 50 is separated.

The barrier layer 11 is formed on a surface of the base substrate 10 opposite to the carrier substrate 50. In one embodiment, the barrier layer 11 is patterned according to a size of each of the cell panels 110. For example, while the base substrate 10 is formed over the entire surface of a mother panel 100, the barrier layer 11 is formed according to a size of each of the cell panels 110, and thus a groove 11a is formed at an interface portion between the barrier layers 11 of the cell panels 110. Each of the cell panels 11 is cut along the groove 11a.

Figure 2A:
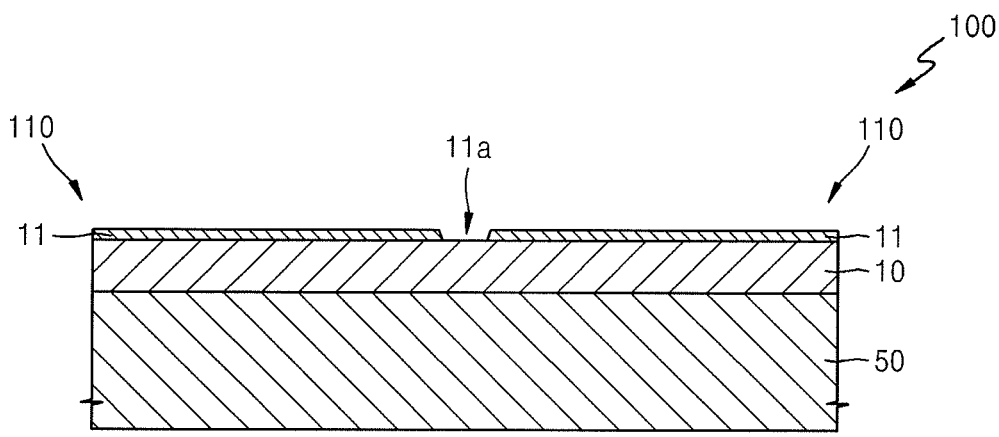
FIGS. 2A through 2D are cross-sectional views for sequentially explaining a method of manufacturing the OLED display of FIG. 1, according to an embodiment.
Figure 2B:
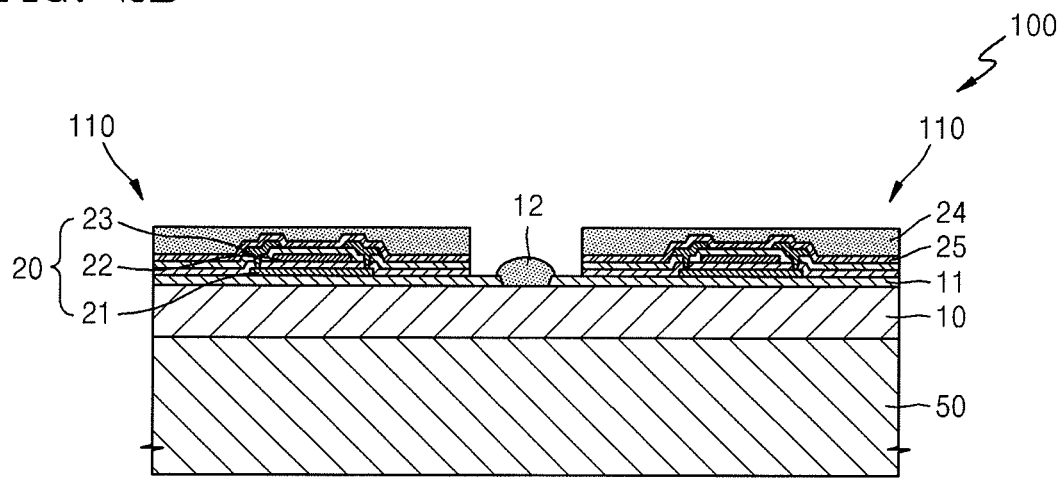

Next, referring to FIG. 2B, the TFT layer 20 of each of the cell panels 110 is formed, and the passivation layer 25 which is an inorganic film and the planarization film 24 which is an organic film are disposed on the TFT layer 20 to cover the TFT layer 20. At the same time as the planarization film 24 formed of, for example, polyimide or acryl is formed, the groove 11a at the interface portion is covered with the organic film 12 formed of, for example, polyimide or acryl. This is to prevent cracks from occurring by allowing the organic film 12 to absorb an impact generated when each of the cell panels 110 is cut along the groove 11a at the interface portion. That is, if the entire barrier layer 11 is entirely exposed without the organic film 12, an impact generated when each of the cell panels 110 is cut along the groove 11a at the interface portion is transferred to the barrier layer 11, thereby increasing the risk of cracks. However, in one embodiment, since the groove 11a at the interface portion between the barrier layers 11 is covered with the organic film 12 and the organic film 12 absorbs an impact that would otherwise be transferred to the barrier layer 11, each of the cell panels 110 may be softly cut and cracks may be prevented from occurring in the barrier layer 11. In one embodiment, the organic film 12 covering the groove 11a at the interface portion and the planarization film 24 are spaced apart from each other. For example, if the organic film 12 and the planarization film 24 are connected to each other as one layer, since external moisture may penetrate into the display unit through the planarization film 24 and a portion where the organic film 12 remains, the organic film 12 and the planarization film 24 are spaced apart from each other such that the organic film 12 is spaced apart from the display unit.

Figure 2C:
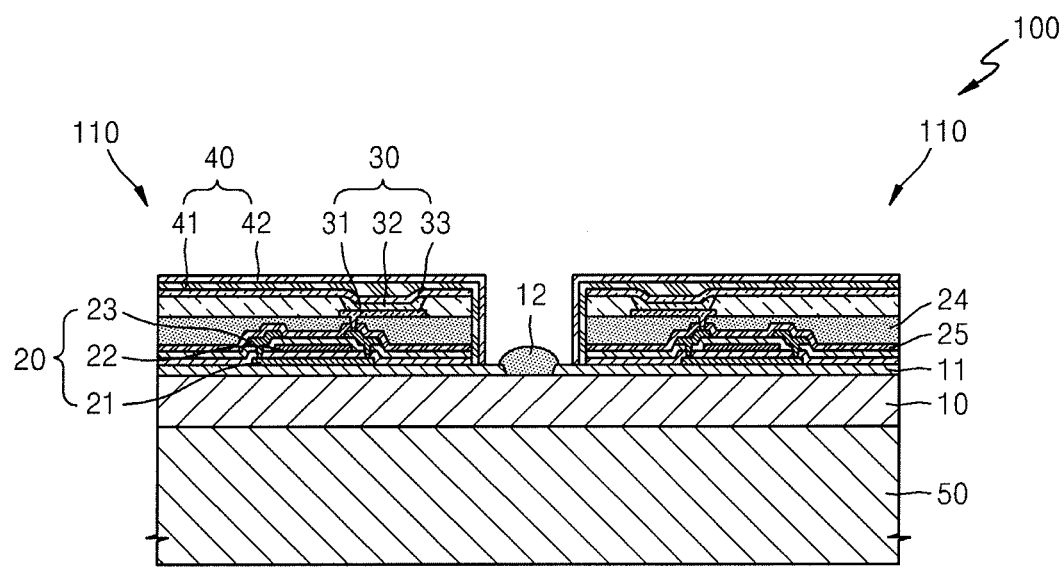

After the planarization film 24 and the organic film 12 are formed, referring to FIG. 2C, the display unit is formed by forming the light-emitting unit 30, and the encapsulation layer 40 is disposed on the display unit to cover the display unit. As such, once the mother panel 100 is completely manufactured, the carrier substrate 50 that supports the base substrate 10 is separated from the base substrate 10. In general, when a laser beam is emitted toward the carrier substrate 50, the carrier substrate 50 is separated from the base substrate 10 due to a difference in a thermal expansion coefficient between the carrier substrate 50 and the base substrate 10.

Figure 2D:
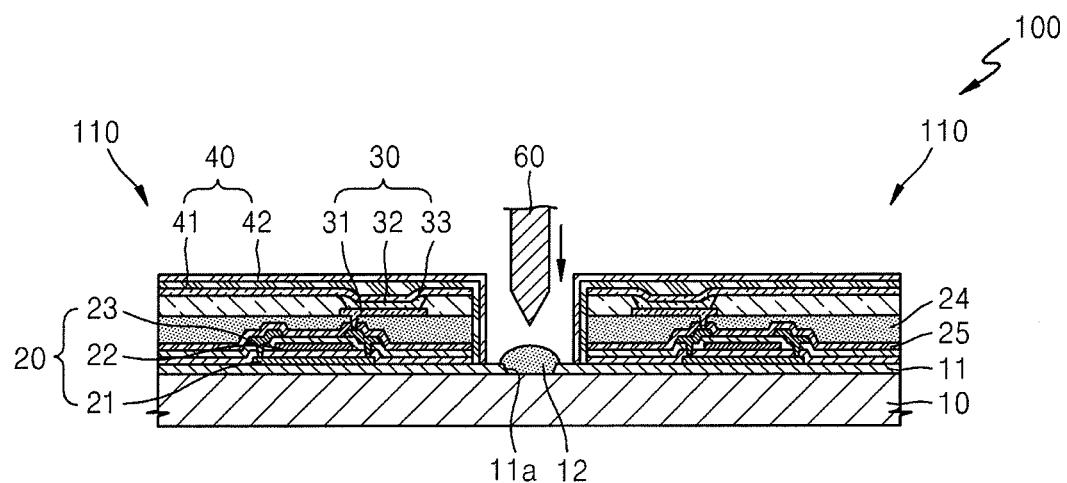

Next, the mother panel 100 is cut in units of the cell panels 110. Referring to FIG. 2D, the mother panel 100 is cut along an interface portion between the cell panels 110 by using a cutter 60. In this case, since the groove 11a at the interface portion along which the mother panel 100 is cut is covered with the organic film 12, the organic film 12 absorbs an impact during the cutting. Accordingly, cracks may be prevented from occurring in the barrier layer 11 during the cutting.

Once the cutting is completed, the OLED display in unites of the cell panels 110 of FIG. 1 is completely manufactured, and part of the organic film 12 remains on the edge portion of the barrier layer 11.

That is, when each of the cell panels 110 is completely manufactured, since the organic film 12 remains on the base substrate 10 while surrounding the edge portion of the barrier layer 11, a portion of the organic film 12 directly contacts the base substrate 10 and a remaining portion of the organic film 12 contacts the barrier layer 11 while surrounding the edge portion of the barrier layer 11. Accordingly, when each of the cell panels 110 is formed with the organic film 12, cracks may be effectively prevented.

Hence, when the OLED display is manufactured by using the method of FIGS. 2A through 2D, cracks may be prevented from occurring in the barrier layer 11 when the mother panel 100 is cut in units of the cell panels 110, thereby reducing a defect rate of a product and stabilizing its quality.

According to at least one of the disclosed embodiments, since cracks may be prevented from occurring at a cut portion when a mother panel is cut in units of cell panels, a defect rate of a product may be reduced and an overall OLED display quality is enhanced.

While the above embodiments have been described with reference to the accompanying drawings, it will be understood by those of ordinary skill in the art that various changes in form and details may be made therein without departing from the spirit and scope of the present invention as defined by the following claims.

What is claimed is:
1. A method of manufacturing an organic light-emitting diode (OLED) display, the method comprising:
   forming a barrier layer on a base substrate of a mother panel;

forming a plurality of display units in units of cell panels on the barrier layer;

forming an encapsulation layer on each of the display units of the cell panels;

applying an organic film to an interface portion between the cell panels, wherein the organic film contacts neither the display units nor the encapsulation layer; and cutting along the interface portion, wherein a groove is formed in the barrier layer, wherein at least a portion of the organic film is formed in the groove, and wherein the groove does not penetrate into the base substrate.

2. A method of manufacturing an organic light-emitting diode (OLED) display, the method comprising:

forming a barrier layer on a base substrate of a mother panel;

forming a plurality of display units in units of cell panels on the barrier layer;

forming an encapsulation layer on each of the display units of the cell panels;

applying an organic film to an interface portion between the cell panels, wherein the organic film contacts neither the display units nor the encapsulation layer; and cutting along the interface portion, wherein each of the display units comprises a thin film transistor (TFT) layer, a planarization film formed on the TFT layer, and a light-emitting unit formed on the planarization film, wherein the organic film is formed of the same material and is substantially simultaneously formed as the planarization film.

3. The method of claim 2, wherein each of the organic film and the planarization film comprises at least one of polyimide and acryl.

4. The method of claim 1, wherein the barrier layer comprises an inorganic film.

5. The method of claim 1, wherein the base substrate is formed of polyimide.

6. A method of manufacturing an organic light-emitting diode (OLED) display, the method comprising:

forming a barrier layer on a base substrate of a mother panel;

forming a plurality of display units in units of cell panels on the barrier layer;

forming an encapsulation layer on each of the display units of the cell panels;

applying an organic film to an interface portion between the cell panels; and cutting along the interface portion, wherein the base substrate is formed of polyimide, and wherein the method further comprises, before forming the barrier layer, attaching a carrier substrate formed of a glass material to another surface of the base substrate, and before the cutting along the interface portion, separating the carrier substrate from the base substrate.

7. The method of claim 1, wherein the encapsulation layer has a thin film encapsulation structure in which a plurality of thin films are stacked.

8. The method of claim 1, wherein the organic film is spaced apart from each of the display units.

9. The method of claim 1, wherein the organic film is formed such that a portion of the organic film directly contacts the base substrate and wherein the remaining portion of the organic film contacts the barrier layer while surrounding an edge portion of the barrier layer.

10. An organic light-emitting diode (OLED) display comprising:

a barrier layer formed on a base substrate;

a display unit formed on the barrier layer;

an encapsulation layer formed on the display unit; and an organic film formed at an edge portion of the barrier layer, wherein the organic film contacts neither the display unit nor the encapsulation layer, wherein a groove is formed in the barrier layer, wherein at least a portion of the organic film is formed in the groove, and wherein the groove does not penetrate into the base substrate.

11. The OLED display of claim 10, wherein the organic film comprises at least one of polyimide and acryl.

12. The OLED display of claim 10, wherein the barrier layer comprises an inorganic film.

13. The OLED display of claim 10, wherein the base substrate is formed of polyimide.

14. The OLED display of claim 10, wherein the organic film is spaced apart from the display unit.

15. The OLED display of claim 10, wherein the organic film is formed on the edge portion of the barrier layer such that a portion of the organic film directly contacts the base substrate and wherein the remaining portion of the organic film contacts the barrier layer while surrounding the edge portion of the barrier layer.

16. The method of claim 1, wherein the display units are formed above the organic film.

17. The method of claim 1, wherein a gap is formed between the organic film and the encapsulation layer.

* * * * *